United States Patent
Boughorbel et al.

(10) Patent No.: US 8,232,523 B2
(45) Date of Patent: Jul. 31, 2012

(54) SEM IMAGING METHOD

(75) Inventors: Faysal Boughorbel, Eindhoven (NL); Cornelis Sander Kooijman, Veldhoven (NL); Berend Helmerus Lich, Weert (NL); Eric Gerardus Theodoor Bosch, Eindhoven (NL)

(73) Assignee: FEI Company, Hillsboro, OR (US)

(*) Notice: Subject to any disclaimer, the term of this patent is extended or adjusted under 35 U.S.C. 154(b) by 0 days.

(21) Appl. No.: 13/098,300

(22) Filed: Apr. 29, 2011

(65) Prior Publication Data

US 2011/0266440 A1 Nov. 3, 2011

Related U.S. Application Data

(60) Provisional application No. 61/394,971, filed on Oct. 20, 2010.

(30) Foreign Application Priority Data

| Apr. 29, 2010 | (EP) | 10161444 |
| Oct. 20, 2010 | (EP) | 10188162 |

(51) Int. Cl.
  *G01N 23/00* (2006.01)
  *G21K 7/00* (2006.01)
(52) U.S. Cl. ........ 250/307; 250/306; 250/310; 250/311; 382/128
(58) Field of Classification Search ............... 250/201.2, 250/201.3, 201.4, 306, 307, 310, 311, 398, 250/399, 461.2, 462.1, 483.1, 484.2, 486.1, 250/488.1, 492.1, 492.3, 526; 382/128, 131, 382/154
See application file for complete search history.

(56) References Cited

U.S. PATENT DOCUMENTS

| 5,412,210 A | 5/1995 | Todokoro et al. |
| 5,594,245 A | 1/1997 | Todokoro et al. |
(Continued)

FOREIGN PATENT DOCUMENTS

EP 0781997 2/1997

OTHER PUBLICATIONS

A. Hyvarinen and E. Oja, Independent Component Analysis: Algorithms and Applications, Neural Networks, 2000 13(4-5):411-430.

(Continued)

*Primary Examiner* — Bernard E Souw
(74) *Attorney, Agent, or Firm* — Scheinberg & Associates, PC; Michael O. Scheinberg; John Kelly

(57) ABSTRACT

A method of investigating a sample using Scanning Electron Microscopy (SEM), comprising the following steps:
  Irradiating a surface (S) of the sample using a probing electron beam in a plurality (N) of measurement sessions, each measurement session having an associated beam parameter (P) value that is chosen from a range of such values and that differs between measurement sessions;
  Detecting stimulated radiation emitted by the sample during each measurement session, associating a measurand (M) therewith and noting the value of this measurand for each measurement session, thus allowing compilation of a data set (D) of data pairs ($P_i$, $M_i$), where $1 \leq i \leq N$, wherein:
  A statistical Blind Source Separation (BSS) technique is employed to automatically process the data set (D) and spatially resolve it into a result set (R) of imaging pairs ($Q_k$, $L_k$), in which an imaging quantity (Q) having value $Q_k$ is associated with a discrete depth level $L_k$ referenced to the surface S.

20 Claims, 3 Drawing Sheets

U.S. PATENT DOCUMENTS

| | | | |
|---|---|---|---|
| 5,777,327 | A | 7/1998 | Mizuno |
| 5,866,904 | A | 2/1999 | Todokoro et al. |
| 5,969,357 | A | 10/1999 | Todokoro et al. |
| 6,114,695 | A | 9/2000 | Todokoro et al. |
| 6,538,249 | B1 | 3/2003 | Takane et al. |
| 6,653,633 | B2 | 11/2003 | Takane et al. |
| 6,936,818 | B2 | 8/2005 | Takane et al. |
| 7,105,815 | B2 | 9/2006 | Obara et al. |
| 7,109,485 | B2 | 9/2006 | Takane et al. |
| 7,312,448 | B2 * | 12/2007 | Principe .................. 250/310 |
| 7,329,868 | B2 | 2/2008 | Takane et al. |
| 7,476,857 | B2 * | 1/2009 | Oosaki et al. ............. 250/310 |
| 7,642,514 | B2 | 1/2010 | Takane et al. |
| 7,804,068 | B2 | 9/2010 | Notte, IV |
| 8,003,940 | B2 * | 8/2011 | Oosaki et al. ............. 250/310 |
| 2004/0267397 | A1 * | 12/2004 | Doddi et al. ............. 700/110 |
| 2007/0114405 | A1 * | 5/2007 | Oosaki et al. ............. 250/310 |
| 2007/0240242 | A1 * | 10/2007 | Modiano et al. ......... 800/284 |
| 2009/0121134 | A1 * | 5/2009 | Oosaki et al. ............. 250/310 |
| 2009/0198635 | A1 * | 8/2009 | Doddi et al. .............. 706/12 |
| 2010/0138026 | A1 * | 6/2010 | Kaushal et al. ........... 700/104 |
| 2010/0216263 | A1 * | 8/2010 | Daniels et al. ............ 438/16 |
| 2010/0288925 | A1 * | 11/2010 | Principe .................... 250/307 |
| 2011/0278453 | A1 * | 11/2011 | Oosaki et al. ............. 250/310 |
| 2011/0295555 | A1 * | 12/2011 | Meessen et al. ........... 702/179 |

OTHER PUBLICATIONS

P. Comon and C. Jutten, Handbook of Blind Source Separation: Independent Component Analysis and Applications, Academic Press, 2010, Chapters 1 & 13.

I.T. Jolliffe, Principal Component Analysis, Series: Springer Series in Statistics XXIX, 2nd ed., 2002, Springer, NY.

Harauz, George, "Symmetry in the 2.25 MDa Homomultimeric Phosphoenolpyruvate Synthase from *Staphylothermus marinus*: Analyses of Negatively Stained Preparations", Micron, Pergamon, Apr. 1, 1998, pp. 161-173 vol. 29, No. 2-3, Oxford, GB.

* cited by examiner

SEM IMAGING METHOD

This application claims priority from U.S. Provisional Pat. App. 61/394,971, filed Oct. 20, 2010, which is hereby incorporated by reference.

TECHNICAL FIELD OF THE INVENTION

The invention relates to a method of investigating a sample using Scanning Electron Microscopy (SEM), comprising the following steps:
- Irradiating a surface (S) of the sample using a probing electron beam in a plurality (N) of measurement sessions, each measurement session having an associated beam parameter (P) value that is chosen from a range of such values and that differs between measurement sessions;
- Detecting stimulated radiation emitted by the sample during each measurement session, associating a measurand (M) therewith and noting the value of this measurand for each measurement session, thus allowing compilation of a data set (D) of data pairs $(P_i, M_i)$, where $1 \leq i \leq N$.

BACKGROUND OF THE INVENTION

A method as set forth in the opening paragraph is known from U.S. Pat. No. 5,412,210, and makes use of the insight that changing the primary beam energy in SEM leads to deeper penetration inside the sample being investigated. In principle, such an approach can be used to generate three-dimensional (3D) tomograms of regions of interest in the sample. Up to now, attempts to exploit this approach have involved acquiring two or more images with increasing primary beam energy, adjusting contrast between the images, and then subtracting lower-energy images from higher-energy images to reveal submerged layers in the sample.

A drawback of such known approaches is that said inter-image contrast adjustment (which is a key step) can only be performed using knowledge about the composition and geometry of the sample. Consequently, prior applications of this technique have tended to limit themselves to wafer defect inspection and other semiconductor applications, in which there is generally good a priori knowledge of the sample's (default) composition and geometry. Since the required compositional and geometrical information is typically not available for biological samples, the known technique has not yet been successfully applied to investigations in the life sciences.

SUMMARY OF THE INVENTION

A method of investigating a sample using Scanning Electron Microscopy (SEM), comprising the following steps:
- Irradiating a surface (S) of the sample using a probing electron beam in a plurality (N) of measurement sessions, each measurement session having an associated beam parameter (P) value that is chosen from a range of such values and that differs between measurement sessions;
- Detecting stimulated radiation emitted by the sample during each measurement session, associating a measurand (M) therewith and noting the value of this measurand for each measurement session, thus allowing compilation of a data set (D) of data pairs $(P_i, M_i)$, where $1 \leq i \leq N$, wherein:
- A statistical Blind Source Separation (BSS) technique is employed to automatically process the data set (D) and spatially resolve it into a result set (R) of imaging pairs $(Q_k, L_k)$, in which an imaging quantity (Q) having value $Q_k$ is associated with a discrete depth level $L_k$ referenced to the surface S.

A suitable example of such a BSS technique is Principal Component Analysis (PCA), e.g. employing a Karhunen-Loeve transform operation. This technique allows high-resolution 3D volume reconstruction from a sequence of backscattered images acquired by a SEM. The method differs from known techniques in that it can be used on complex samples with unknown structure. With this method, one can compute compensation factors between high- and low-energy images using second-order (or higher-order) multivariate statistics, which allows for the effective separation of different depth layers in a sample without using a priori knowledge of sample structure. The method has a wide range of applications in life-science and material science imaging.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The invention will now be elucidated in more detail on the basis of exemplary embodiments and the accompanying schematic drawings, in which.

Figure 1:
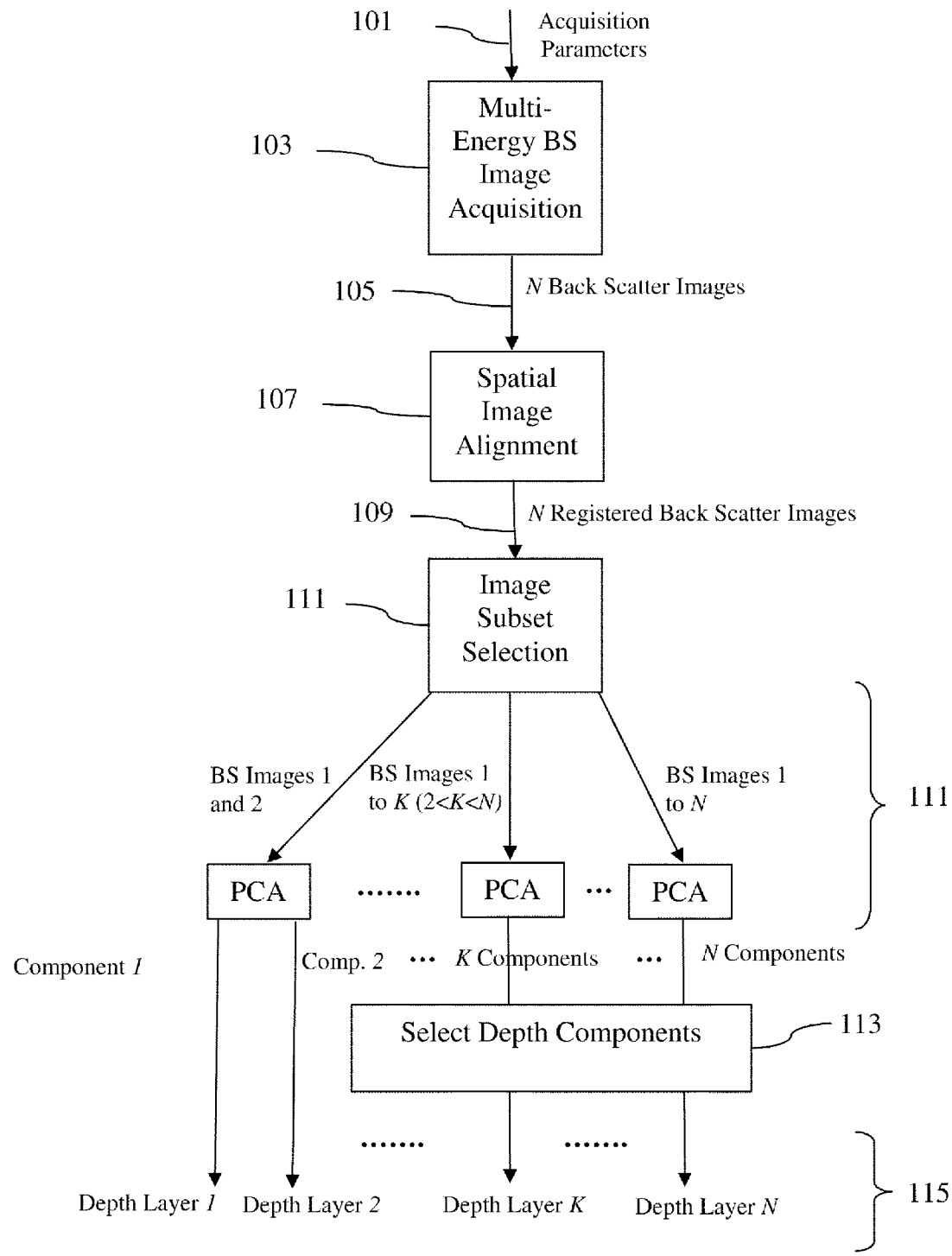
FIG. 1 shows a flowchart that schematically depicts a scheme for performing a particular embodiment of the method according to the present invention.

The accompanying drawings are intended to aid in understanding the present invention and, unless otherwise indicated, are not drawn to scale. In the Figures, where pertinent, corresponding parts are indicated using corresponding reference symbols. For purposes of clarity, not every component may be labeled in every drawing.

DETAILED DESCRIPTION OF PREFERRED EMBODIMENTS

It is an object of the present invention to address the issue set forth above. More specifically, it is an object of the present invention to provide a SEM imaging method that lends itself to application with samples comprising unknown composition/geometry. In particular, it is an object of the present invention that such a method should allow automatic deconvolution of measured SEM data, and automatic generation of depth-resolved imagery.

These and other objects are obtained in a SEM-based method as set forth in the opening paragraph, characterized in that a statistical Blind Source Separation technique is employed to automatically process the data set (D) and spatially resolve it into a result set (R) of imaging pairs ($Q_k$, $L_k$), in which an imaging quantity (Q) having value $Q_k$ is associated with a discrete depth level $L_k$ referenced to the surface S.

In research leading to the invention, the inventors realized that, for complex samples with unknown structures (such as those encountered in biological applications, for example), it is generally not possible to perform the prior-art signal value adjustment through user input. This is due inter alia to the fact that characteristics at a scanned location (such as the density and thickness of stain for biological samples) are not known a priori to the SEM user. Given that the SEM image is formed as a localized interaction between the employed (scanned) electron beam and irradiated sample areas having such unknown characteristics, having no more information at hand than the employed beam properties will prevent determination of signal adjustment factors. Moreover, the content of deeper layers (levels) will be unknown, thus preventing the user from reliably using multiple trials at different adjustment parameters in order to reveal some information about subsurface regions.

To deal with this problem, the inventors set themselves the goal of developing an automatic approach for determining scaling factors from measured data. In analyses that ultimately culminated in the development of the present inventive approach, the inventors arrived at the following insights:

Signals associated with backscattered (BS) electrons generally yield sufficient information from all generation depths within their detectable range.

The mathematical Point Spread Function (PSF) of BS electrons in several types of samples, including stained bio-samples and polymers, is generally (highly) linear.

The PSF of detectable BS electrons in such samples was also shown to be (highly) laterally confined throughout a depth of several tens of nanometers (more than 50 nm). This fact proves to be highly useful for 3D volume imaging, since it means that one will have a relatively low loss of lateral resolution if one uses BS signals to probe inside a sample.

In complex samples, encountered across a range of applications, signals coming from layers (levels) located at different depths in a sample tend to be highly independent in a statistical sense, given that different layers are likely to contain different structures and a wide range of local density and topology variations.

These realizations ultimately allowed the inventors to develop a generalized, automated method of tomographic (volume) imaging of a general class of samples using SEM. More particularly, exploiting the insights set forth above, the inventors found that they could use second-order and higher-order statistics from a range of Blind Source Separation (BSS) techniques to disentangle (de-convolute/spatially resolve) signals coming from different layer (level) depths within a general sample. In particular, the technique of Principal Component Analysis (PCA) was found to be quite successful in this context.

In a particular embodiment of the method according to the present invention, PCA is applied to a set of N spatially aligned (and, if necessary, scaled) images acquired with varying primary beam energy and BS electron detection, or alternatively using energy band filtering. After mean-centering each image and applying PCA, one obtains a set of N de-correlated images that are related to the input ones by linear transformations (each input image can be expressed as a linear combination of these de-correlated images). The linear mappings can be obtained using various suitable methods, such as a Karhunen-Loeve Transform, for example. The inventors noticed that new information in BS images acquired with increasing primary landing energy is mostly due to signals coming from new depth layers reached by the incident electrons; the effect of PCA de-correlation thus results in the effective separation of the different depth layers. Using PCA, one obtains several de-correlated images, including a strong component associated with the matrix material of the sample (e.g. epoxy in the case of stained life-science samples). The inventors observed that sets of images with lower Eigenvalues in a Karhunen-Loeve transform correspond to deeper layers. In the image associated with these deeper components, top layers are canceled using information from all available lower energy images.

Based on these observations, one can develop an algorithm that uses N input images, as follows:

Step 1. Acquire N BS images at increasing landing energies.

Step 2. Laterally align and/or scale the image sequence thus obtained.

Step 3. To compute (distil) the image associated with a discrete layer (level) of ordinal k counted from the sample surface (k=1 ... N):

Apply PCA decomposition to the first k images in the sequence.

Boost independent components having low weight (which emanate from deeper layers); this can, for example, be done by multiplying such components by a weighting factor that is equal or proportional to the reciprocal of their PCA (e.g. Karhunen-Loeve) Eigenvalue.

Reconstruct a depth image with re-weighted independent components and a background (matrix) component.

Step 4. Post-process the obtained sequence using 2D and 3D de-noising and restoration methods. If desired, so-called "layer de-blurring" (viz. lateral/xy de-convolution) can also be performed at this stage.

Using such an approach, the relative thickness of the computed slices (layers/levels) can be adjusted by suitable choice of the beam energy increments applied during acquisition of the BS image sequence. This can result in very high depth resolution in many applications, especially when the associated PSF has good linearity.

The discussion above makes multiple references to PCA, but it should be realized that this is not the only BSS technique that can be applied in the context of the present invention. For example, one could alternatively employ Independent Component Analysis (ICA), which decomposes a set of input images in a way similar to PCA, but minimizes an entropy-based mutual information criterion instead of a correlation criterion. Alternatively, one could consider employing techniques such as Singular Value Decomposition (SVD) or Positive Matrix Factorization (PMF). More information with regard to BSS techniques can, for example, be gleaned from:

{1} P. Comon and C. Jutten, *Handbook of Blind Source Separation: Independent Component Analysis and Applications*, Academic Press, 2010.

{2} A. Hyvärinen and E. Oja, *Independent Component Analysis: Algorithms and Applications*, Neural Networks, 13(4-5):411-430, 2000.

{3} I. T. Jolliffe, *Principal Component Analysis*, Series: Springer Series in Statistics XXIX, 2nd ed., Springer, N.Y., 2002.

In the dissertation above:
(i) The stimulated radiation comprises backscattered (BS) electrons. However, in principle, one could also exploit other types of stimulated radiation, such as secondary electrons or X-ray radiation, for example. An advantage of BS electrons over X-rays, for example, is that X-rays are generally not produced at relatively low incident beam energies, whereas BS electrons are.
(ii) The beam parameter (P) is beam energy (landing energy). However, in principle, one could alternatively select beam convergence angle (incidence angle) or beam focal depth (penetration depth) as the beam parameter to be varied.
(iii) The measurand (M) is detector current (associated with BS electrons). However, one could also select intensity as a measurand (e.g. when detecting X-rays as stimulated radiation).
(iv) The imaging quantity (Q) is intensity. However, one could also choose other imaging quantities, such as current, energy spread or angular distribution, for example. Often, Q and M will be chosen to be the same quantity; however, one can also choose a different quantity for Q than for M.

In an embodiment of the method according to the present invention, successive values of the measurement parameter (P) associated with successive measurement sessions differ from one another by a substantially constant increment ($\Delta P$), and successive discrete depth levels in the obtained result set (R) are correspondingly separated from one another by a substantially constant distance increment ($\Delta L$). In experiments, the inventors observed that, for example, in commonly used, high-Z-stained biological samples, increments in landing energy of 100 eV typically resulted in distance increments of the order of about 4-5 nm (i.e. of the order of a bilayer) between successive subsurface levels ($L_k$) in the result set R. However, it should be noted that P does not have to change by a constant increment between successive measurement sessions, and that successive levels $L_k$ also do not have to be spaced at equal distance increments.

One should take care not to confuse the present invention with known tomographic techniques based on Transmission Electron Microscopy (TEM), whereby depth information is gleaned from a sample by employing a range of different sample tilt angles. Inter alia, one can identify the following differences between the two:
 TEM apparatus is generally much more expensive than SEM apparatus.
 The TEM approach uses much higher input beam energies (typically of the order of 200-300 keV), which can cause sample damage. In contrast, the method according to the present invention works satisfactorily with much lower input beam energies (e.g. of the order of 1-5 keV).
 TEM tomography can only be used on very thin samples (generally <1 μm in thickness). Because the present invention does not rely on transmission of electrons through the sample, it does not suffer from this restriction on sample thickness.
 A SEM-based technique such as that used in the present invention has a much greater lateral reach than a TEM-based technique, because of the (lateral) scanning nature of the former.
 By its very nature, TEM tomography does not generate the type of convoluted depth data associated with the present invention, and, accordingly, does not require statistical processing techniques to perform depth resolution upon such convoluted data.

The methodology set forth above can be described as entailing "computational slicing" into a sample. It is advantageous in that it provides very good z-resolution, but is limited as regards the extent of its z-penetration into the sample (z being a coordinate perpendicular to an x/y surface of the sample). If desired, such computational slicing can be combined with "physical slicing", so as to provide a hybrid approach that augments the obtainable z-penetration. Such physical slicing involves the physical removal of (at least one layer of) material from the sample, and may be performed using mechanical techniques (e.g. using a microtome/diamond knife) and/or radiative/ablative techniques (e.g. using a laser beam or broad ion beam, or milling the sample by scanning a focused ion beam over it). In a particular embodiment of such a hybrid approach, the above-mentioned computational slicing and physical slicing are employed alternately, whereby:
 An exposed surface S of a sample is investigated using the computational slicing technique according to the current invention;
 A physical slicing technique is then used to "skim" off material from the surface S, thus creating a newly exposed surface S' at a depth D below S;
 This newly exposed surface S' is then investigated using the computational slicing approach according to the current invention;
 If desired, several iterations of this hybrid approach are performed, involving alternate application of computational slicing and physical slicing, and thus providing greater and greater z-penetration into the sample.

Embodiment 1

FIG. 1 shows a flowchart of an embodiment of a SEM-based 3D volume imaging method according to the present invention. The various steps in this flowchart can be further elucidated as follows:
101: Acquisition parameters are decided upon. Here, one makes selections as regards N (number of measurement sessions), P (beam parameter to be varied between measurement sessions), $\Delta P$ (size of increment in P between measurement sessions), the stimulated radiation to be detected, and M (which measurand of the stimulated radiation is to be measured). For example, one may choose N=7, P=landing energy, $\Delta P$=100 eV, stimulated radiation=BS electrons, M=BS electron current.
103: On the basis of the parameters selected in step 101, a set of BS images is acquired. These images represent convoluted data as regards depth information in the sample under investigation.
105: The N acquired BS images form a raw data set.
107: The elements of the data set are laterally aligned and/or scaled with one another to form an aligned data set.
109: The aligned data set acts as input set for a statistical de-convolution operation in accordance with the invention.
111: An iterative series of data processing steps is performed in which, for each integral value of k in the range [2, ..., N], PCA decomposition is applied to the subset of data pairs ($P_i$, $M_i$), i=1, ..., k.
113: Independent components of this decomposition having least correlation to the decomposed subset are identified.
115: The least-correlated components thus identified are associated with level $L_k$ beneath the surface S.

In this manner, one generates a result set R=(($Q_1$, $L_1$), ..., ($Q_N$, $L_N$)) comprising a spectrum of discrete levels $L_k$ progressing from the surface (S) into the sample.

Embodiment 2

Figure 2A:
FIGS. 2A and 2B show results of a SEM-based investigation of a stained biological sample, without (FIG. 2A) and with (FIG. 2B) application of a method according to the present invention.
Figure 2B:

FIGS. 2A and 2B show results of SEM-based 3D slicing into progressively deeper layers of a stained biological sample (in this particular case, a brain cell of a mouse). In both cases, the sample was irradiated at progressively higher energies—in the range 700 eV to 1900 eV, in 200 eV increments—and BS electrons emanating from the irradiated sample were detected. The results are illustrated as follows:
- FIG. 2A shows the BS image sequence of a mitochondrion in the sample, without any attempt at de-convolution of detected data.
- FIG. 2B shows a corresponding image sequence after application of a method according to the present invention, representing de-convolved, depth-resolved images of the same mitochondrion, and revealing 3D structures not (clearly) visible in FIG. 2A.

Embodiment 3

The linearity assumptions in image formation elucidated above can be represented in the model:

$$Q = AI \quad (1)$$

in which:
- $I = (I_1, I_2, \ldots, I_N)^T$ is the set of images acquired by varying beam parameters;
- $Q = (Q_1, Q_2, \ldots, Q_N)^T$ is a set of source images that are statistically de-correlated and that represent information coming from different depth layers (levels);
- $A = (a_1, a_2, \ldots, a_N)^T$ is a square matrix transforming the original images into so-called principal components.

PCA decomposition obtains the factorization in equation (1) by finding a set of orthogonal components, starting with a search for the one with the highest variance.

The first step consists in minimizing the criterion:

$$a_1 = \arg\max_{\|a\|=1} E\{(a^T I)^2\} \quad (2)$$

The next step is to subtract the found component from the original images, and to find the next layer with highest variance.

At iteration $1 < k \leq N$, we find the kth row of the matrix A by solving:

$$a_k = \arg\max_{\|a\|=1} E\left\{\left(a^T\left(I - \sum_{i=1}^{k-1} w_i w_i^T I\right)\right)^2\right\} \quad (3)$$

It can be shown (see, for example, literature references {1} and {3} referred to above) that successive layer separation can be achieved by using so-called Eigenvector Decomposition (EVD) of the covariance matrix $\Sigma_I$ of the acquired images:

$$\Sigma_I = E\{I^T I\} = EDE^T \quad (4)$$

in which:
- E is the orthogonal matrix of eigenvectors of $\Sigma_I$;
- $D = \mathrm{diag}(d_1, \ldots, d_N)$ is the diagonal matrix of Eigenvalues.

The principal components can then be obtained as $$Q = E^T I \quad (5)$$

The Eigenvalues are directly related to the variance of the different components:

$$d_i = (\mathrm{var}(Q_i))^2 \quad (6)$$

In cases in which noise plays a significant role, the components with lower weights (Eigenvalues) may be dominated by noise. In such a situation, the inventive method can be limited to the K (K<N) most significant components. The choice to reduce the dimensionality of the image data can be based on the cumulative energy and its ratio to the total energy:

$$r = \frac{\sum_{i=1}^{K} d_i}{\sum_{i=1}^{N} d_i} \quad (7)$$

One can choose a limit for the number of employed layers K based on a suitable threshold value t. A common approach in PCA dimensionality reduction is to select the lowest K for which one obtains $r \geq t$. A typical value for t is 0.9 (selecting components that represent 90% of the total energy).

Noise effects can be minimized by recombining several depth layers with a suitable weighting scheme. Additionally, re-weighting and recombination of layers can be useful to obtain an image contrast similar to the original images. In the previously described PCA decomposition, the strongest component (in terms of variance) is commonly associated with the background (matrix) material. Adding this component to depth layers enhances the visual appearance and information content of the obtained image. One can achieve the effect of boosting deeper-lying layers, reducing noise, and rendering proper contrast by re-scaling the independent components by their variances and reconstructing the highest-energy image using the rescaled components, as follows:

$$Q = ED^{-\frac{1}{2}} E^T I \quad (8)$$

The skilled artisan will appreciate that other choices for the linear weighting of depth layers can also be used.

Embodiment 4

As an alternative to the PCA decomposition set forth above, one can also employ a BSS approach based on ICA. In ICA, one assumes a linear model similar to (1). The main difference with PCA is that one minimizes a higher-order statistical independence criterion (higher than the second-order statistics in PCA), such as so-called Mutual Information (MI):

$$MI(Q_1, \ldots, Q_N) = \sum_{i=1}^{N} H(Q_i) - H(Q) \quad (9)$$

With marginal entropies computed as:

$$H(Q) = -\sum_{k=1}^{S} P(Q_i = q_k) \log(P(Q_i = q_k)) \quad (10)$$

and the joint entropy:

$$H(Q) = -\sum_{k=1}^{S} P(Q_i = q_k, \ldots, Q_N = q_k) \log(P(Q_i = q_k, \ldots, Q_N = q_k)) \quad (11)$$

in which:
P(Q) is the probability distribution of the imaging quantity Q;
$q_k$ is a possible value for said imaging quantity; and
S is the total number of scanned sites on the sample (e.g. in the case of rectangular images, this is the product of height and width).

Other criteria—such as the so-called Infomax and Negentropy—can also be optimized in ICA decomposition. Iterative methods—such as FastICA—can be employed to efficiently perform the associated depth layer separation task. Adding more constraints to the factorization task can lead to more accurate reconstruction. If one adds the condition that sources (layers) render non-negative signals and that the mixing matrix is also non-negative, one moves closer to the real physical processes underlying image formation. A layer separation method based on such assumptions may use the so-called Non-Negative Matrix Decomposition (NMD) technique with iterative algorithms.

For more information, see literature references {1} and {2} cited above.

Embodiment 5

In yet another alternative—using NMD—one solves the non-negativity-constrained minimization problem:

$$\min_{Q \geq 0, L \geq 0} J(A, L) = \min_{Q \geq 0, L \geq 0} \|Q - AL\|^2 \quad (12)$$

in which J(A,L) is a particular criterion pertaining to two matrices A and L.

One common approach to solving this problem is to use the so-called Alternating Least Squares (ALS) algorithm, where one first minimizes the criterion J(A,L) in (12) with respect to one of the sought matrices, then minimizes for the second matrix, and then repeats these two steps until convergence is obtained. If we minimize first with respect to A, we compute the derivative of the criterion and then set it to zero:

$$\frac{\partial J(A, L)}{\partial A} = -(A^T Q - A^T A L) = 0 \quad (13)$$

resulting in the updated rule:

$$L = (A^T A)^{-1} A^T Q \quad (14)$$

Computing the derivative with respect to L and setting to zero leads to a second updated rule:

$$A = Q L^T (L L^T)^{-1} \quad (15)$$

In every iteration, the matrices are computed according to rules (14) and (15), and the pertinent non-negativity constraint (symbolized by $[.]_+$; see below) is imposed—for example by truncating any negative values to zero or by using an active set method as explained in reference {2}—leading to:

$$L = [(A^T A)^{-1} A^T Q]_+ \quad (16)$$

$$A = [Q L^T (L L^T)^{-1}]_+ \quad (17)$$

If the imaging noise deviates significantly from Gaussian, other divergence measures D(Q∥AL), such as the Kullback-Leibler divergence or other I-divergence measures, can be used instead of a least squares criterion.

Embodiment 6

Figure 3:
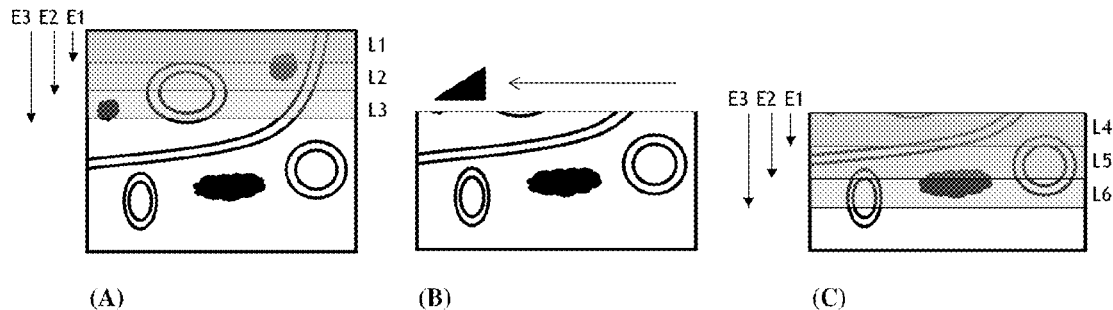
FIG. 3 schematically illustrates a hybrid technique involving the alternate use of computational slicing and physical slicing as set forth above.

FIG. 3 illustrates an embodiment of the current invention whereby computational slicing (e.g. as set forth in Embodiments 1, 3 and/or 4 above) is combined with physical slicing, so as to allow SEM-based 3D volume imaging (with excellent z-resolution) at progressively deeper regions of a sample (thus yielding greater overall z-penetration).

FIG. 3A (left) depicts a computational slicing step, whereby a sample is scanned with varying landing energies ($E_1, E_2, E_3$) and a depth layer separation algorithm is applied, as set forth above. This allows (virtual) imaging of discrete depth levels ($L_1, L_2, L_3$).

In FIG. 3B (center), subsequent use is made of a physical slicing step, whereby a mechanical cutting device (e.g. a diamond knife) or a non-mechanical approach (e.g. involving a focused/broad beam of ions, or a focused electromagnetic beam) is used to physically "skim off" a certain depth of material from the sample, thus producing a newly exposed surface.

In FIG. 3C (right), one executes a subsequent computational slicing operation on said newly exposed surface. This allows (virtual) imaging of new discrete depth levels ($L_4, L_5, L_6$).

Figure 4:
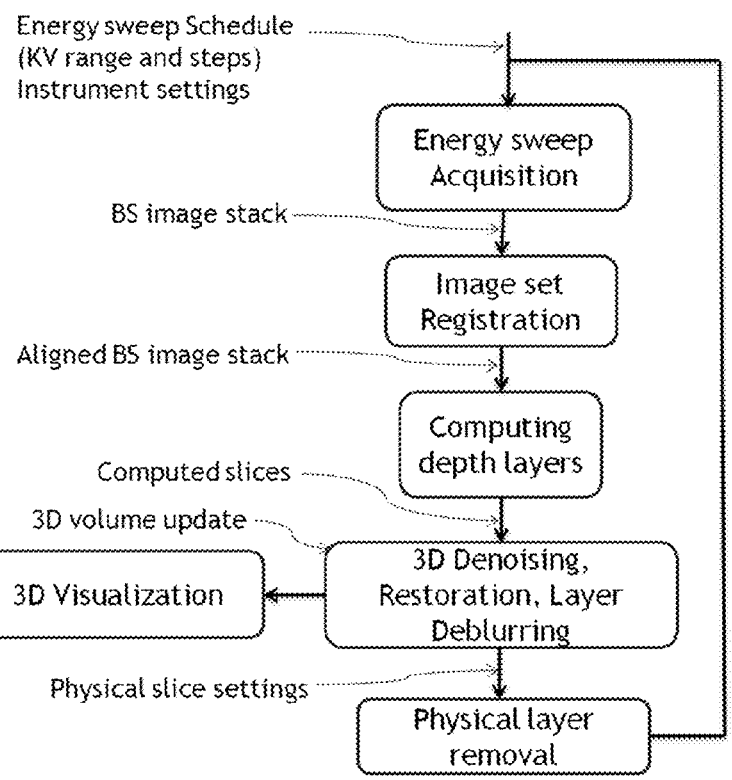
FIG. 4 is a flowchart that schematically illustrates the alternate application of computational slicing and physical slicing in one or more iterations.

This combined/hybrid approach is further elucidated in the flowchart of FIG. 4. The computational slicing procedure in this flowchart is similar to that depicted in FIG. 1 (for example), but is here followed by a physical slicing procedure (refer to the "physical layer removal" step at the bottom of the flowchart in FIG. 4), with a subsequent (iterative) return to the top of the flowchart. Such alternate application of computational slicing and physical slicing techniques can be repeated for as many iterations as are necessary to achieve a given cumulative z-penetration into a particular sample.

We claim as follows:
1. A method of investigating a sample using Scanning Electron Microscopy, comprising the following steps:
irradiating a surface (S) of the sample using a probing electron beam in a plurality (N) of measurement sessions, each measurement session having an associated beam parameter (P) value that is chosen from a range of such values and that differs between measurement sessions;
detecting stimulated radiation emitted by the sample during each measurement session, associating a measurand (M) therewith and noting a value of the measurand for each measurement session, thus allowing compilation of a data set (D) of data pairs ($P_i, M_i$), where $1 \leq i \leq N$;
employing a statistical Blind Source Separation technique to automatically process the data set (D) and spatially resolve the data set into a result set (R) of imaging pairs ($Q_k, L_k$), in which an imaging quantity (Q) having a value $Q_k$ is associated with a discrete depth level $L_k$ referenced to the surface S.
2. The method according to claim 1, wherein:
successive values of the beam parameter (P) associated with successive measurement sessions differ from one another by a substantially constant increment ($\Delta P$); and successive discrete depth levels in the obtained result set (R) are separated from one another by a substantially constant distance increment ($\Delta L$).

3. The method as claimed in claim 1, wherein:
the beam parameter (P) is selected from the group comprising beam energy, beam convergence angle and beam focal depth;
the stimulated radiation is selected from the group comprising secondary electrons, backscattered electrons and X-ray radiation; and
the measurand (M) is selected from the group comprising intensity and current.

4. The method as claimed in claim 1, wherein the imaging quantity (Q) is selected from the group comprising intensity, current, angular distribution and energy spread.

5. The method according to claim 1, wherein the statistical Blind Source Separation technique is selected from the group comprising Principal Component Analysis (PCA) and Independent Component Analysis (ICA).

6. The method according to claim 5, wherein:
the statistical Blind Source Separation technique is PCA;
the beam parameter (P) comprises beam energy, whereby successive measurement sessions have a larger associated value of this parameter;
the stimulated radiation comprises secondary electrons and the measurand (M) comprises current;
the imaging quantity (Q) comprises intensity;
an alignment transform is performed on the elements of the data set D so as to laterally align and/or scale them;
an iterative series of data processing steps is performed in which, for each integral value of k in the range [2, ..., N]:
PCA decomposition is applied to the subset of data pairs ($P_i$, $M_i$), i=1, ..., k;
an independent component of this decomposition having least correlation to said subset is identified, and the independent component is associated with level $L_k$ beneath the surface S,
whereby the result set R=(($Q_1$, $L_1$), ..., ($Q_N$, $L_N$)) is generated for a spectrum of discrete levels $L_k$ progressing from the surface (S) into the sample.

7. The method according to claim 6, wherein:
components of the PCA decomposition are relatively weighted using a weight factor that, for a given component, is equal or proportional to the reciprocal of the Eigenvalue for that component; and
the result set (R) is augmented by adding to the elements of the result set (R) a factor corresponding to a matrix response of the sample.

8. The method according to claim 6, wherein said PCA decomposition is a Karhunen-Loeve transform operation.

9. The method according to claim 1, wherein the obtained result set (R) is post-processed using statistical noise reduction and restoration techniques.

10. The method according to claim 1, wherein the result set (R) yields information regarding both a geometry and a material composition of the sample.

11. The method according to claim 1, wherein:
said steps of irradiating the surface (S) of the sample, detecting stimulated radiation emitted by the sample to obtain the data set (D), and applying a statistical Blind Source Separation technique to process the data set (D), are comprised in a computational slicing step; and
said computational slicing step is combined with a physical slicing step, whereby a physical material removal method is used to physically remove a layer of material from the original surface (S), thereby revealing a newly exposed surface (S').

12. The method as claimed in claim 11, wherein said physical material removal method is selected from the group comprising mechanical milling with a blade device, ion milling with an ion beam, and ablation with a beam of electromagnetic energy.

13. The method as claimed in claim 11, wherein said computational slicing step and said physical slicing step are alternately repeated in multiple iterations.

14. An apparatus constructed and arranged to carry out the method of claim 1.

15. An apparatus for investigating a sample using Scanning Electron Microscopy, the apparatus comprising:
means for irradiating a surface (S) of the sample using a probing electron beam in a plurality (N) of measurement sessions, each measurement session having an associated beam parameter (P) value that is chosen from a range of such values and that differs between measurement sessions;
means for detecting stimulated radiation emitted by the sample during each measurement session, associating a measurand (M) therewith and noting a value of the measurand for each measurement session, thus allowing compilation of, a data set (D) of data pairs ($P_i$, $M_i$), where $1 \leq i \leq N$;
means for employing a statistical Blind Source Separation technique to automatically process the data set (D) and spatially resolve the data set into a result set (R) of imaging pairs ($Q_k$, $L_k$), in which an imaging quantity (Q) having a value $Q_k$ is associated with a discrete depth level $L_k$ referenced to the surface S.

16. The apparatus of claim 15, wherein:
successive values of the beam parameter (P) associated with successive measurement sessions differ from one another by a substantially constant increment ($\Delta P$); and
successive discrete depth levels in the obtained result set (R) are separated from one another by a substantially constant distance increment ($\Delta L$).

17. The apparatus of claim 15, wherein:
the beam parameter (P) is selected from the group comprising beam energy, beam convergence angle and beam focal depth;
the stimulated radiation is selected from the group comprising secondary electrons, backscattered electrons and X-ray radiation;
the measurand (M) is selected from the group comprising intensity and current;
the imaging quantity (Q) is selected from the group comprising intensity, current, angular distribution and energy spread; and
the statistical Blind Source Separation technique is selected from the group comprising Principal Component Analysis (PCA) and Independent Component Analysis (ICA).

18. The apparatus of claim 17, wherein:
the beam parameter (P) comprises beam energy, whereby successive measurement sessions have a larger associated value of this parameter;
the stimulated radiation comprises secondary electrons;
the measurand (M) comprises current;
the imaging quantity (Q) comprises intensity;

the statistical Blind Source Separation technique is PCA;
the apparatus further comprising:
- means for performing an alignment transform on the elements of the data set D so as to laterally align and/or scale them;
- means for performing an iterative series of data processing steps comprising, for each integral value of k in the range [2, ..., N]:
  - applying PCA decomposition to the subset of data pairs $(P_i, M_i)$, where i=1, ..., k;
  - identifying an independent component of the PCA decomposition having least correlation to said subset, and
  - associating the independent component with level $L_k$ beneath the surface S,
- means for generating the result set R=$((Q_1, L_1), ..., (Q_N, L_n))$ for a spectrum of discrete levels $L_k$ progressing from the surface (S) into the sample.

19. The apparatus of claim 1, further comprising means for physically removing a layer of material from the original surface (S), thereby revealing a newly exposed surface (S').

20. The apparatus of claim 19, wherein said means for physically removing a layer of material is selected from the group comprising:
- means for mechanical milling with a blade device,
- means for ion milling with an ion beam, and
- means for ablation with a beam of electromagnetic energy.

* * * * *